United States Patent
O'Riain et al.

(10) Patent No.: US 6,908,831 B2
(45) Date of Patent: Jun. 21, 2005

(54) METHOD FOR FABRICATING A SEMICONDUCTOR STRUCTURE WITH AN ENCAPSULATION OF A FILLING WHICH IS USED FOR FILLING TRENCHES

(75) Inventors: Lincoln O'Riain, Dresden (DE); Jörg Radecker, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/966,994

(22) Filed: Oct. 15, 2004

(65) Prior Publication Data

US 2005/0095788 A1 May 5, 2005

(30) Foreign Application Priority Data

Oct. 15, 2003 (DE) ........................... 103 48 021

(51) Int. Cl.[7] ............................. H01L 21/762
(52) U.S. Cl. ........................ 438/435; 438/437
(58) Field of Search ................. 438/435, 437, 438/FOR 227; 257/221, E21.546

(56) References Cited

U.S. PATENT DOCUMENTS

| 5,229,317 | A | | 7/1993 | Nishio |
| 6,376,893 | B1 | | 4/2002 | Rha |
| 6,544,861 | B2 | * | 4/2003 | Joo .............................. 438/424 |
| 6,596,607 | B2 | * | 7/2003 | Ahn ............................ 438/424 |
| 2002/0072198 | A1 | * | 6/2002 | Ahn ............................ 438/424 |
| 2003/0013271 | A1 | | 1/2003 | Knorr et al. |
| 2003/0013272 | A1 | * | 1/2003 | Hong et al. ................. 438/437 |
| 2003/0022453 | A1 | * | 1/2003 | Park ........................... 438/353 |

FOREIGN PATENT DOCUMENTS

DE  101 57 785 A1  6/2003

* cited by examiner

*Primary Examiner*—George Fourson
(74) *Attorney, Agent, or Firm*—Laurence A. Greenberg; Werner H. Stemer; Ralph E. Locher

(57) ABSTRACT

A method for encapsulating a filling in a trench of a semiconductor substrate includes providing a first barrier layer in a trench and a second barrier layer disposed above the first barrier layer. The trench is filled with a filling, which is subsequently etched back in an upper trench section, so that a hole is produced and a filling residue remains in a lower trench section. Subsequently, a non-conformal cover layer is provided in an upper trench section, so that the cover layer of a bottom region has a first thickness greater than a second thickness of a wall region of the cover layer. The cover layer and the second barrier layer are isotropically etched-back and removed from the upper trench section, and the first barrier layer remains. The bottom region remains covered resulting in the filling residue being encapsulated by the first barrier layer and the residual cover layer.

11 Claims, 6 Drawing Sheets

METHOD FOR FABRICATING A SEMICONDUCTOR STRUCTURE WITH AN ENCAPSULATION OF A FILLING WHICH IS USED FOR FILLING TRENCHES

BACKGROUND OF THE INVENTION

Field of the Invention

The present invention relates to a method for fabricating a semiconductor structure with an encapsulation of a filling which is used for filling trenches.

Large scale and very large scale integrated devices have a prominent role in silicon technology since the intention is for more and more devices to have space or to be integrated per chip area. In this case, filling deep trenches or buried insulation of doped material or dielectrics for capacitors, for example for storage capacitors of DRAMs, and also filling IT-trenches or trenches having high aspect ratios (AR >5:1) constitute a general challenge in sub-100 nm silicon technologies. The complete encapsulation of doped material is necessary in order to block outdiffusion of dopant atoms, e.g. boron or phosphorus, into the silicon crystal (active area) and, on the other hand, to protect the doped material, which is readily etched, against subsequent wet-chemical etching processes. The capsule containing the doped material additionally serves as an etching stop during subsequent high-temperature processes, such as, for example, vertical/surrounding gate patterning (poly RIE). An oxide which satisfies the material properties, reflow at moderate temperatures (at around 800° C.), low-stress growth, low layer shrinkage during baking, for large scale integration within a trench is borophosphosilicate glass (BPSG), for example. Hitherto, borophosphosilicate glass has not been used as an insulation material, despite its good flow properties, in the FEOL stage of silicon technology since the problem of boron/phosphorus encapsulation has not been solved. Attempts at covering over the borophosphosilicate glass with a high-density oxide are risky, hardly shrinkable owing to the required oxide thickness, and because it is not possible to remove excess nitride liners at the walls of the trenches.

SUMMARY OF THE INVENTION

It is accordingly an object of the invention to provide a method for fabricating a semiconductor structure with an encapsulation of a filling which is used for filling trenches which overcomes the above-mentioned disadvantages of the prior art methods of this general type. More specifically, the invention teaches the encapsulation of a doped material within a trench of a semiconductor substrate, the doped material preferably being a borophosphosilicate glass (BPSG).

The idea on which the present invention is based includes nonconformally depositing a cover layer above a partly etchedback filling in a trench, in which case the non-conformal deposition method can provide filling layers having an aspect ratio of greater than 5, and thus provides a much higher material thickness in horizontal regions than in vertical regions. Afterward, the cover layer is etched back isotropically by the smaller thickness of the vertical regions, so that the vertical regions of the cover layer are entirely removed and a residual cover layer remains at the horizontal regions in order to cover over the filling in a capsule.

In the present invention, the problem mentioned in the introduction is solved in particular by a method for encapsulating a filling or a doped material within a trench of a semiconductor substrate. The method includes provision of a first barrier layer in a trench provided in a semiconductor substrate and provision of a second barrier layer above the first barrier layer. The trench is filled with a filling. The filling is etched-back in an upper trench section, so that a hole is produced in an upper trench section and a filling residue remains in a lower trench section. A cover layer is non-conformally produced in the upper trench section, so that a first thickness of a bottom region of the cover layer is greater than a second thickness of a wall region of the cover layer. The cover layer and the second barrier layer in the upper trench section are isotropic etched-back, so that, in the wall region, the cover layer and also the second barrier layer are removed and the first barrier layer remains and the bottom region remains covered by a residual cover layer, as a result of which the filling residue is encapsulated by the first barrier layer and the residual cover layer in a capsule.

In accordance with one preferred development, a silicon nitride liner ($Si_3N_4$ liner) is deposited as the cover layer.

In accordance with a further preferred development, the silicon nitride liner deposited as the cover layer is formed as a high-density silicon nitride liner, an HDP-SiN liner, since a high density of the cover layer is required in order to avoid possible "leaks" in the topology that enable outdiffusion of dopant atoms.

In accordance with a further preferred development, a high-density chemical vapor deposition method (HDP-CVP method) is provided as the method for depositing the cover layer or the silicon nitride liner or the high-density silicon nitride liner. The high-density chemical vapor deposition method inherently provides a high aspect ratio (AR >5:1) between horizontal deposition planes and vertical deposition planes, precisely the high aspect ratio and the subsequent wet-chemical etching-back forming a residual cover layer at the bottom region, which layer closes the capsule, without excess nitride liners remaining at the wall regions of the trench.

In accordance with a further preferred development, a silicon nitride liner ($Si_3N_4$ liner) is provided as the second barrier layer. Providing the second barrier layer as a silicon nitride liner and the cover layer as a silicon nitride liner results in that a homogeneous material transition is available, so that both layers can be etched back isotropically by an etching-back process.

In accordance with a further preferred development, a borophosphosilicate glass (BPSG) is provided as the filling since a borophosphosilicate glass (BPSG) has very good flow properties, the reflow can be carried out at moderate temperatures (around 800° C.), BPSG provides low-stress growth and has low layer shrinkage during baking.

Other features which are considered as characteristic for the invention are set forth in the appended claims.

Although the invention is illustrated and described herein as embodied in a method for fabricating a semiconductor structure with an encapsulation of a filling which is used for filling trenches, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
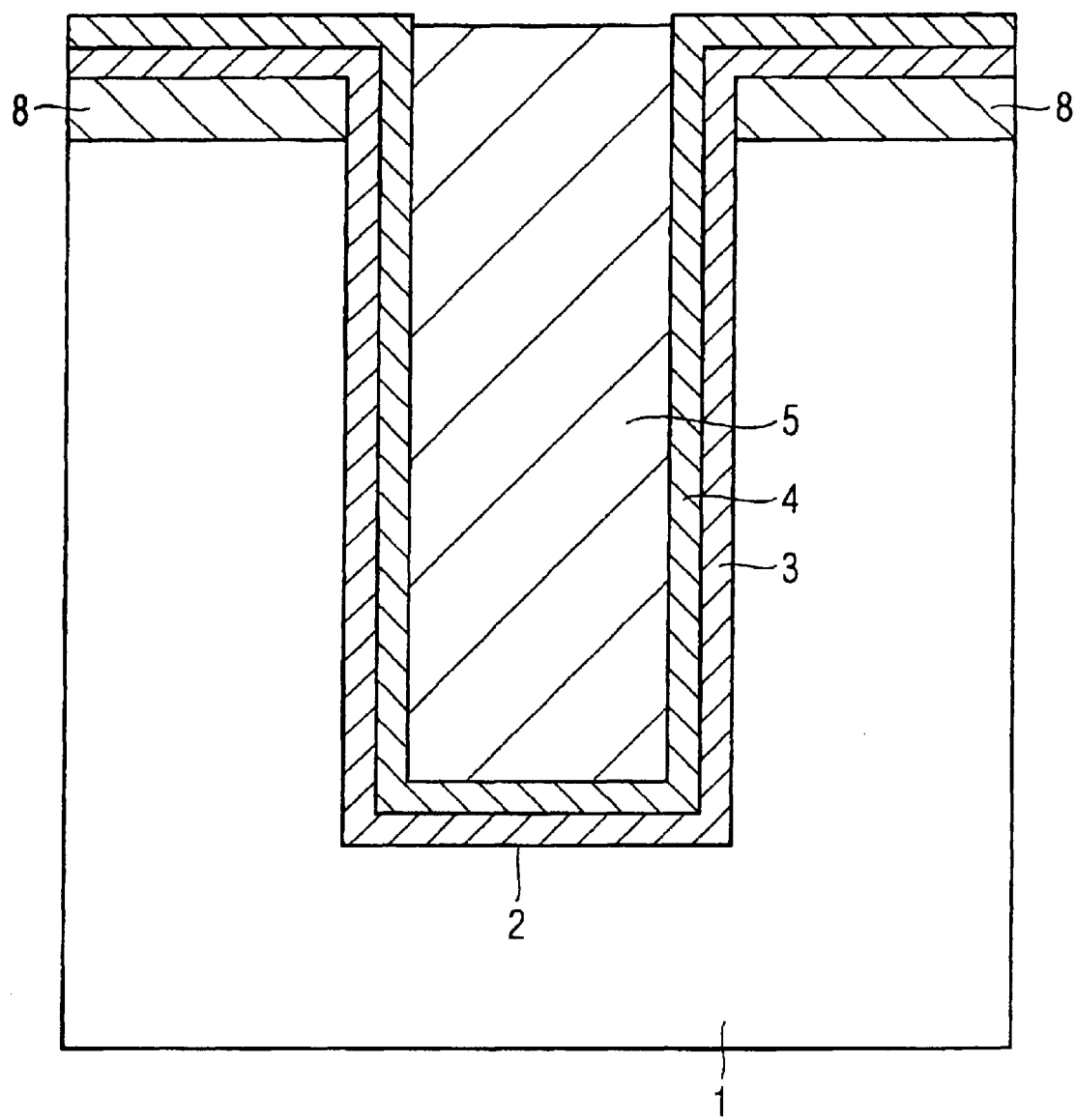
FIG. 1 is a diagrammatic, cross-sectional view of an intermediate step of a preferred embodiment of a method according to the invention.

In all the figures of the drawing, sub-features and integral parts that correspond to one another bear the same reference symbol in each case. Referring now to the figures of the drawing in detail and first, particularly, to FIG. 1 thereof, there is shown the invention described below with reference to semiconductor structures and semiconductor fabrication processes, it is not restricted thereto, but rather can be used in diverse ways.

A description is given below, on the basis of an exemplary embodiment, of a process chain according to the invention for encapsulating a filling 5, preferably a doped material, with reference to FIGS. 1–4.

First, FIG. 1 illustrates a semiconductor substrate 1, on which a hard mask 8 covers the regions of the semiconductor substrate 1 which are not intended to be treated subsequently. A deep trench 2 is etched into a region of the semiconductor substrate 1 which is not covered by the hard mask 8. A first barrier layer 3, preferably a silicon oxide, is optionally deposited in the trench 2. Afterward, a second barrier layer 4, preferably a silicon nitride liner, is deposited above the first barrier layer 3. The trench 2 is thereupon filled with the filling 5, preferably a doped material, e.g. a borophosphosilicate glass (BPSG). According to the invention, borophosphosilicate glass (BPSG) is preferably used as an insulation material or dielectric since, on the one hand, it has very good flow properties, which can be utilized for avoiding "shrink holes" or voids, on the other hand it has a reflow at moderate temperatures, preferably not higher than 800° C., and it additionally has low-stress growth and a low layer shrinkage during baking in a non-illustrated furnace. The positive material properties of the BPSG are utilized in a method—subsequent to filling—for increasing the packing density of the filling, a so-called reflow method. The reflow method is followed by a method for removing filling material projecting from the trench, a so-called chemical mechanical polishing (CMP).

Figure 2:
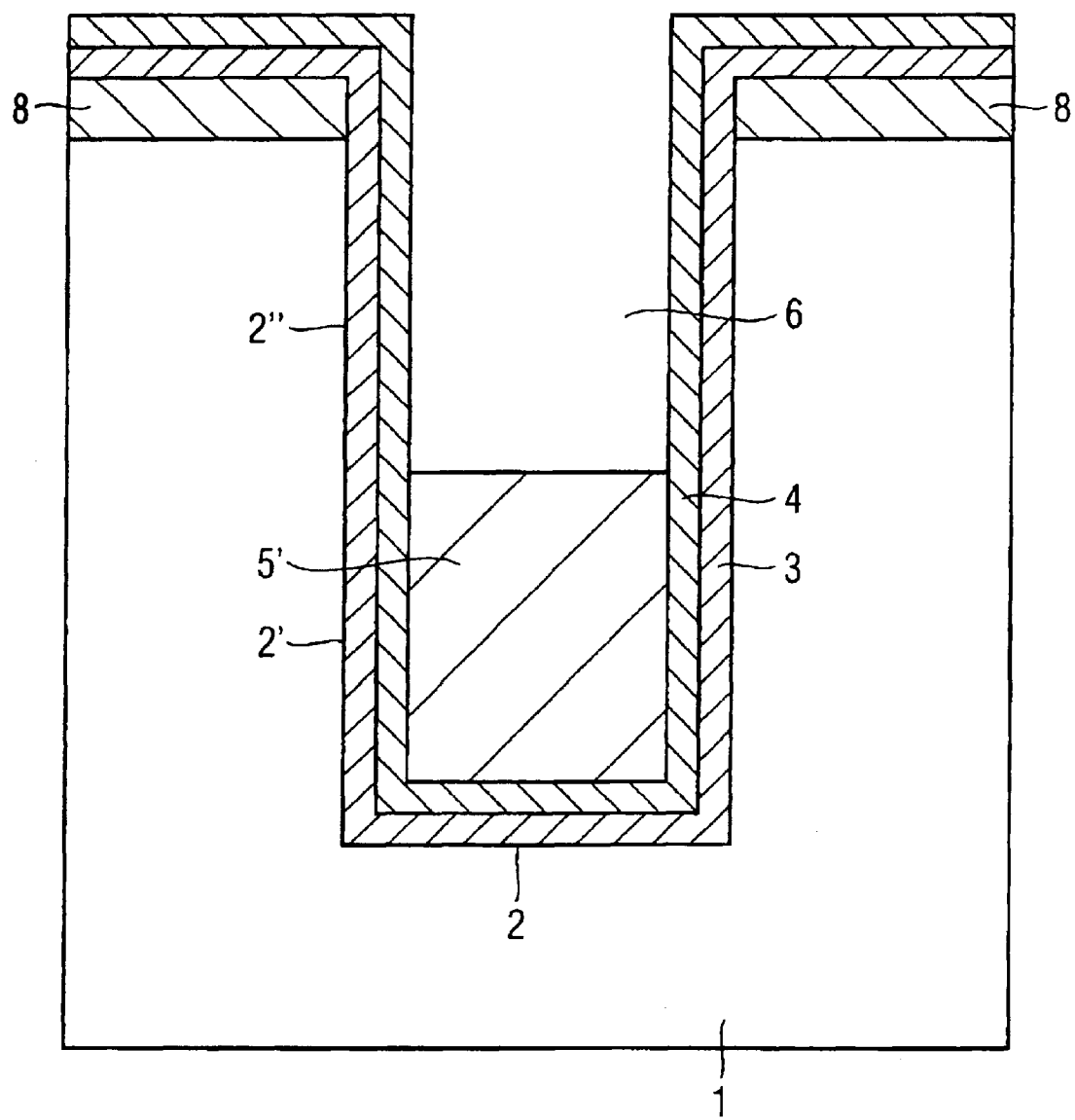
FIG. 2 is a diagrammatic, cross-sectional view of the preferred embodiment of the method in accordance with FIG. 1 after a succeeding process step.

With reference to FIG. 2, a cross-sectional view in accordance with the configuration of FIG. 1 is illustrated, the filling 5 being etched back in an upper trench section 2", so that a hole 6 is produced in the upper trench section 2" and a filling residue 5' remains in a lower trench section 2'.

Figure 3:
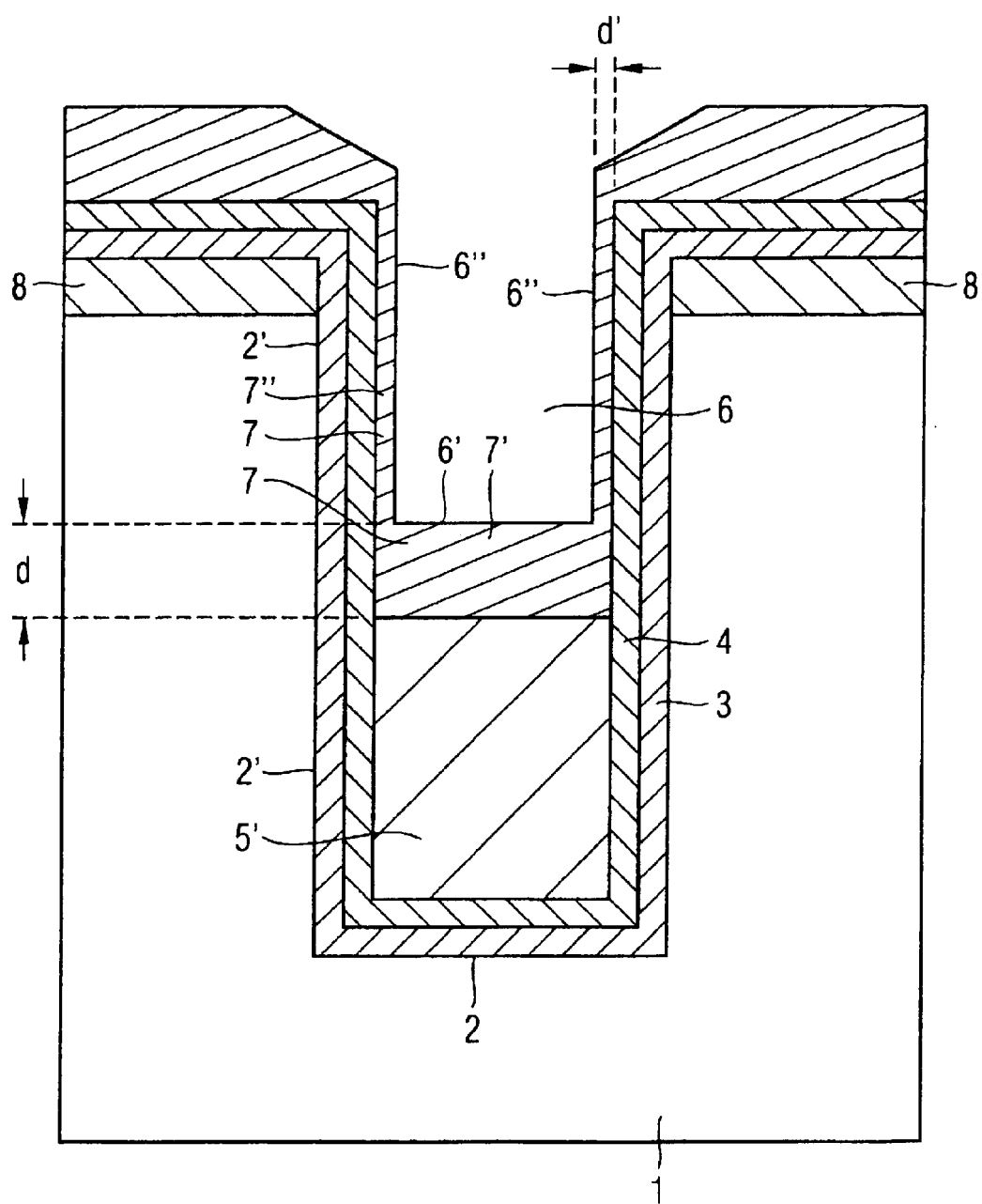
FIG. 3 is a diagrammatic, cross-sectional view of the preferred embodiment of the method in accordance with FIG. 2 after a succeeding process step.

With reference to FIG. 3, a cross-sectional view in accordance with the configuration shown in FIG. 2 is illustrated, a cover layer 7 is deposited non-conformally in the upper trench section 2". According to the invention, non-conformal deposition of the cover layer 7 results in that the cover layer 7' at a bottom region 6' has a greater first thickness d than the cover layer 7" of a wall region 6" having a second thickness d'. The ratio of the first thickness d of the cover layer 7' at the bottom region 6' to the second thickness d' of the cover layer 7" at the wall region 6" is at least 5:1. The ratio is called the aspect ratio and (AR >5:1) is provided according to the invention.

Figure 4:
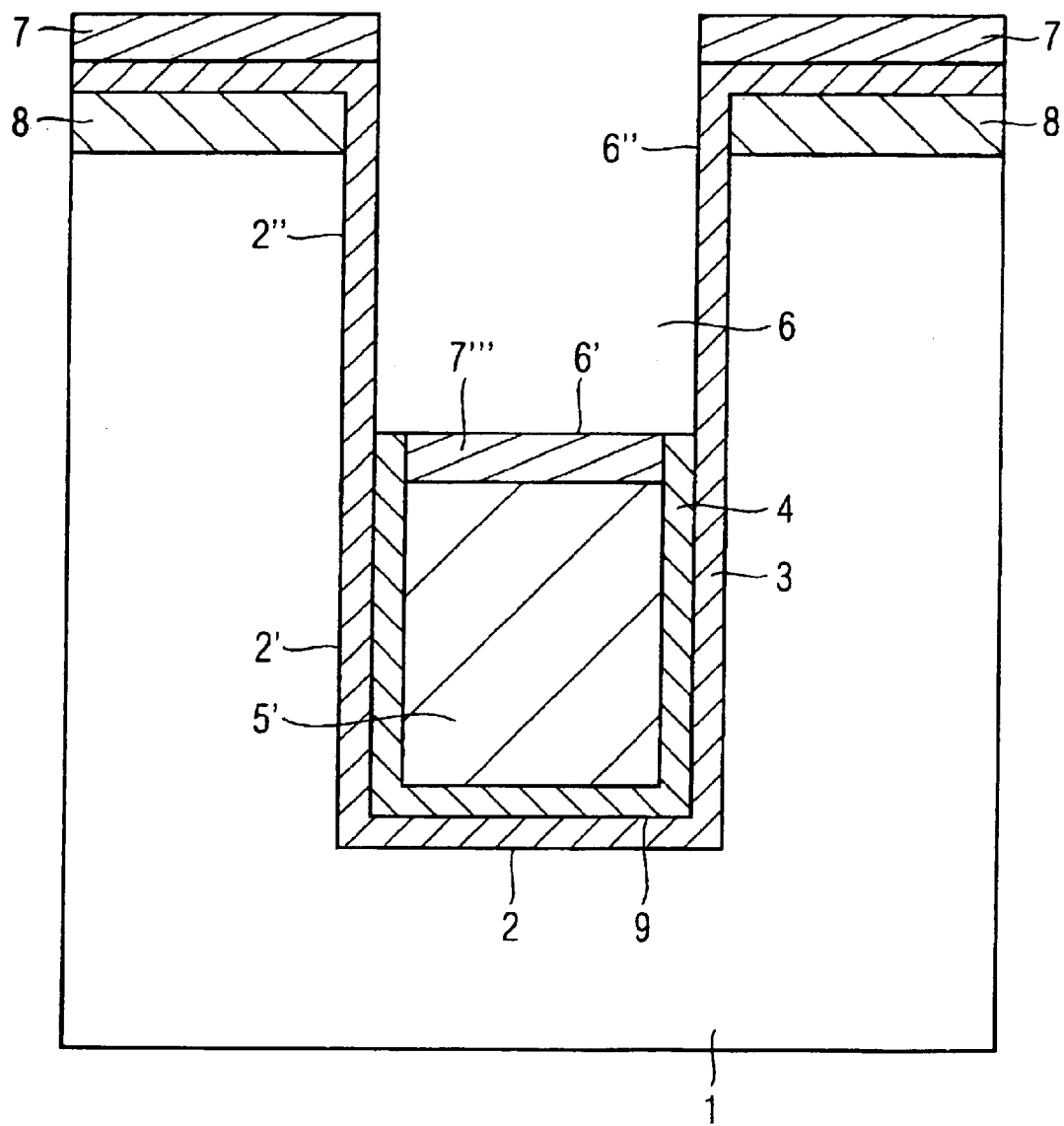
FIG. 4 is a diagrammatic, cross-sectional view of the method of the invention after the last process step.

With reference to FIG. 4, a cross-sectional view in accordance with the configuration of FIG. 3 is illustrated, an isotropic etching-back process is performed in the upper trench section 2". In this case, the wall region 6" of the hole 6 is freed of the cover layer 7" and also of the second barrier layer 4. Since the sum of the thickness d' of the cover layer 7" and the thickness of the second barrier layer 4 is less than the thickness d of the cover layer 7' and an isotropic etching-back process is performed, a residual cover layer 7'" will remain at the bottom region 6' of the hole 6. The residual cover layer 7'" forms the cover for a capsule 9 for encapsulating the filling residue 5'. The remaining sides of the capsule 9 are provided by the second barrier layer 4.

Consequently, the filling residue 5', preferably a borophosphosilicate glass, is buried deep in the trench 2 in a manner encapsulated in the capsule 9.

Figure 5:
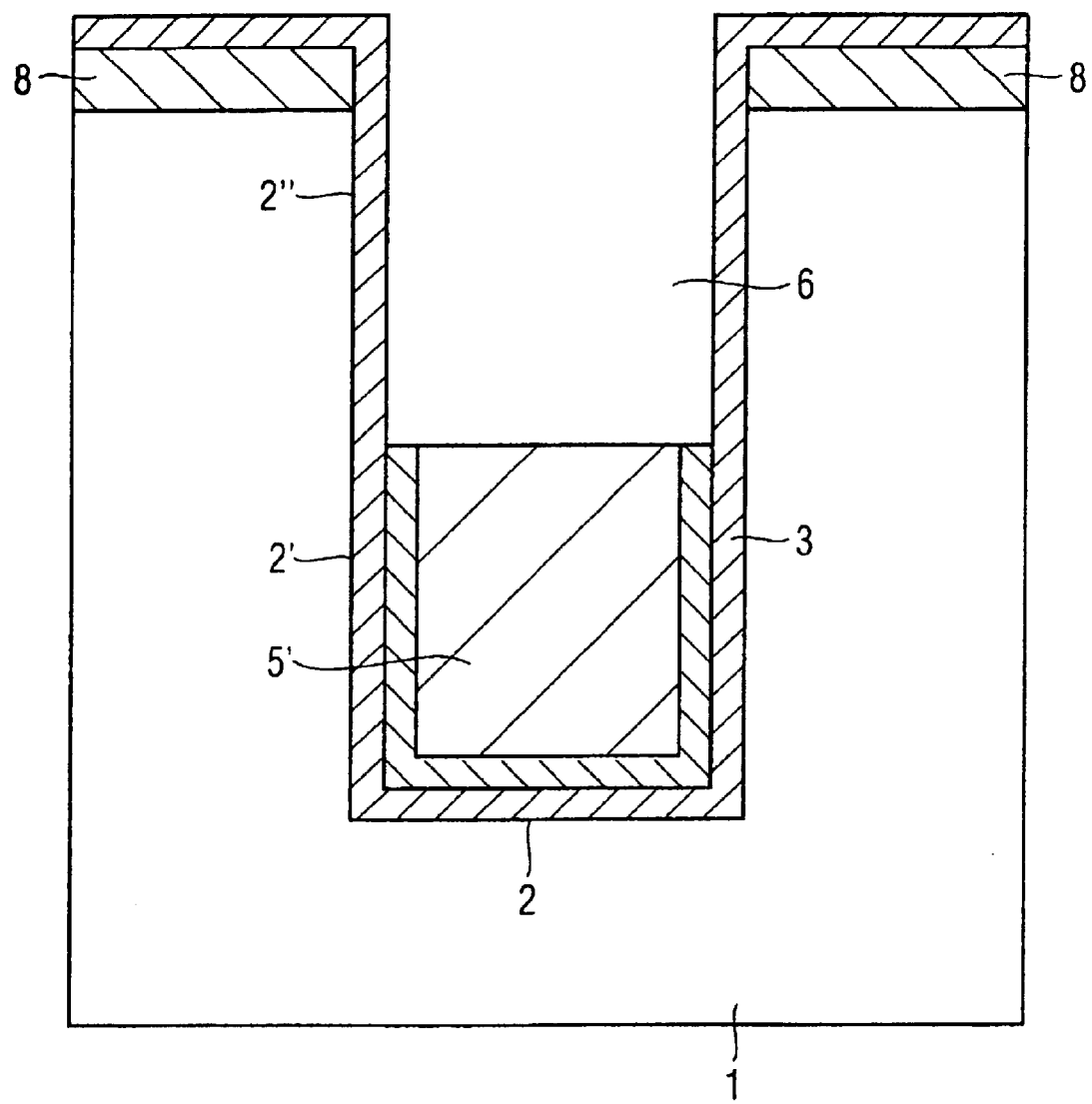
FIGS. 5 and 6 are cross-sectional views of a preferred development of the method of the invention, the process step according to FIG. 3 being divided into two mutually separate process steps.
Figure 6:
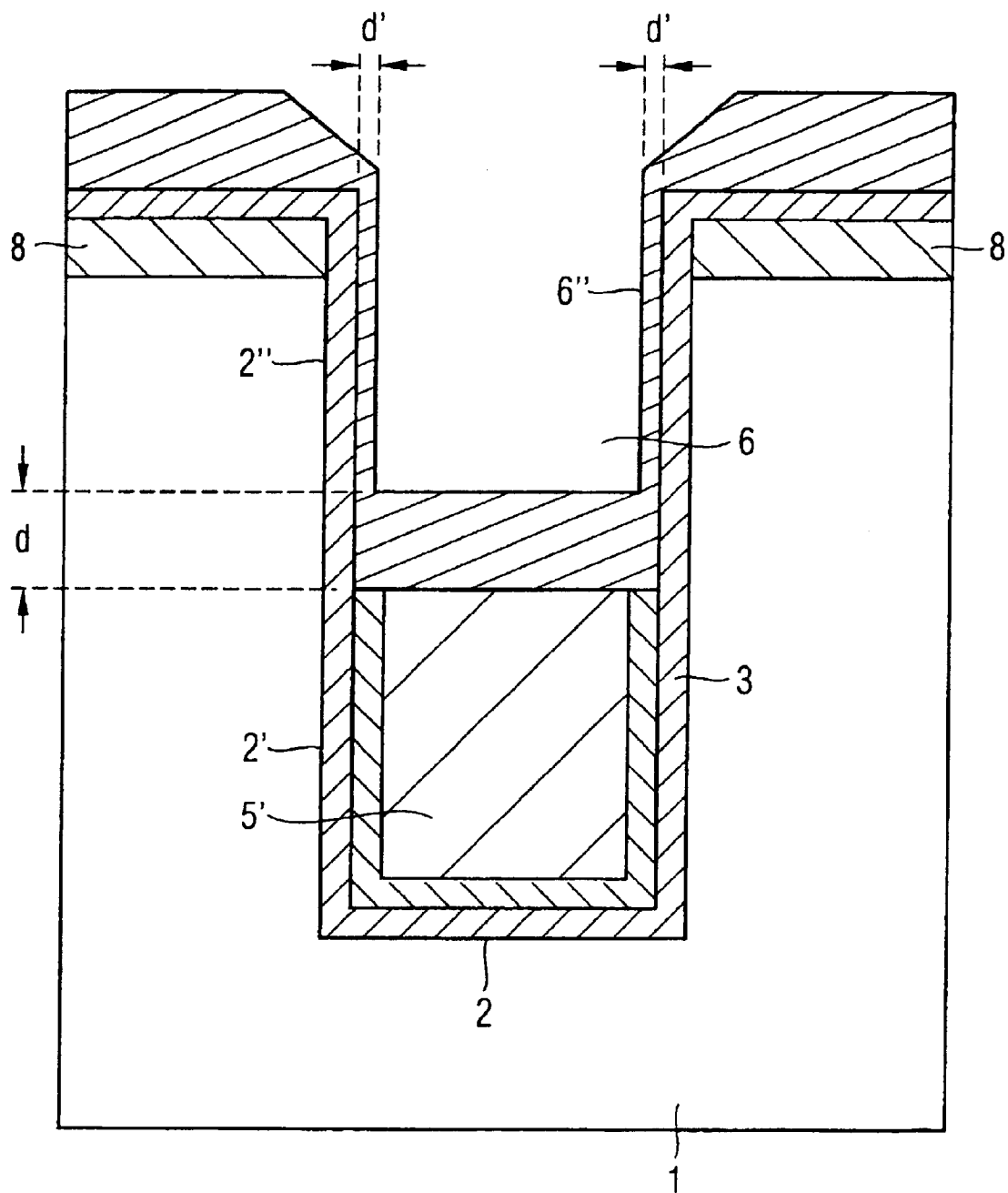

Subsequently, in a preferred development of the invention, the process chain according to the invention is extended to the effect that the process step according to FIG. 3 is divided into two mutually separate process steps (FIGS. 5 and 6).

With reference to FIG. 5, a cross-sectional view in accordance with the configuration as shown in FIG. 2 is illustrated, the second barrier layer 4 being removed in the upper trench section 2" within the hole 6 by a dedicated process step.

With reference to FIG. 6, a cross-sectional view in accordance with the configuration as shown in FIG. 5 is illustrated, the cover layer 7 is deposited non-conformally in the upper trench section 2". The ratio of the first thickness d of the cover layer 7' at the bottom region 6' to the second thickness d' of the cover layer 7" at the wall region 6" is at least 5:1. Since the second barrier layer 4 has already been removed in the process step according to FIG. 5, the isotropic etching-back process (see FIG. 4) will only remove a second thickness d' of the cover layer 7" from the cover layer 7. The result, an encapsulated filling residue 5' in the capsule (9), of the preferred development of the invention is equivalent to the preferred embodiment of the invention (FIGS. 1–4).

Although the present invention has been described above on the basis of preferred exemplary embodiments, it is not restricted thereto, but rather can be modified in diverse ways. Thus, the method can also be applied to other substrates or carrier materials in addition to semiconductor substrates.

This application claims the priority, under 35 U.S.C. § 119, of German patent application No. 103 48 021.8, filed Oct. 15, 2003; the entire disclosure of the prior application is herewith incorporated by reference.

We claim:

1. A method for fabricating a semiconductor structure, which comprises the steps of:
    providing a semiconductor substrate having a trench formed therein;
    providing a first barrier layer in the trench of the semiconductor substrate;
    providing a second barrier layer above the first barrier layer;
    filling the trench with a filling;
    etching-back the filling in an upper trench section, resulting in a formation of a hole in the upper trench section and a filling residue remaining in a lower trench section;

providing a non-conformal cover layer in the upper trench section, the cover layer having a bottom region with a first thickness greater than a second thickness of a wall region of the cover layer; and isotropic etching-back of the cover layer and of the second barrier layer in the upper trench section, so that, in the wall region, the cover layer and also the second barrier layer are removed and the first barrier layer remains and the bottom region remains covered by a residual cover layer, as a result of which the filling residue is encapsulated by the first barrier layer and the residual cover layer in a capsule.

2. The method according to claim 1, which further comprises forming the cover layer as a silicon nitride liner.

3. The method according to claim 1, which further comprises forming the cover layer as a high-density silicon nitride liner.

4. The method according to claim 1, which further comprises depositing the cover layer using a high-density chemical vapor deposition method.

5. The method according to claim 2, which further comprises depositing the silicon nitride liner using a high-density chemical vapor deposition method.

6. The method according to claim 3, which further comprises depositing the high-density silicon nitride liner using a high-density chemical vapor deposition method.

7. The method according to claim 1, which further comprises forming the cover layer with an aspect ratio of at least 5.

8. The method according to claim 2, which further comprises forming the silicon nitride liner with an aspect ratio of at least 5.

9. The method according to claim 3, which further comprises forming the high-density silicon nitride liner with an aspect ratio of at least 5.

10. The method according to claim 1, which further comprises forming the second barrier layer as a silicon nitride liner.

11. The method according to claim 1, which further comprises forming the filling from borophosphosilicate glass (BPSG).

* * * * *